United States Patent
Yoshida et al.

(10) Patent No.: US 11,720,080 B2
(45) Date of Patent: Aug. 8, 2023

(54) PARAMETER OPTIMIZATION DEVICE, METHOD AND PROGRAM

(71) Applicant: Nippon Telegraph and Telephone Corporation, Tokyo (JP)

(72) Inventors: Syuhei Yoshida, Tokyo (JP); Yuta Ukon, Tokyo (JP); Koji Yamazaki, Tokyo (JP); Koyo Nitta, Tokyo (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 118 days.

(21) Appl. No.: 17/251,739

(22) PCT Filed: May 21, 2019

(86) PCT No.: PCT/JP2019/020104
§ 371 (c)(1),
(2) Date: Dec. 11, 2020

(87) PCT Pub. No.: WO2019/239820
PCT Pub. Date: Dec. 19, 2019

(65) Prior Publication Data
US 2021/0116882 A1 Apr. 22, 2021

(30) Foreign Application Priority Data
Jun. 13, 2018 (JP) ................. 2018-112515

(51) Int. Cl.
*G05B 19/4097* (2006.01)
(52) U.S. Cl.
CPC .......... *G05B 19/4097* (2013.01); *G05B 2219/31338* (2013.01)

(58) Field of Classification Search
CPC .................. G05B 19/4097; G05B 2219/31338
See application file for complete search history.

(56) References Cited

U.S. PATENT DOCUMENTS 5,367,651 A * 11/1994 Smith ................. G06F 8/441
717/149
10,380,313 B1 * 8/2019 Schumacher ......... G06F 30/331
(Continued)

FOREIGN PATENT DOCUMENTS

JP 5516596 B2 6/2014

*Primary Examiner* — Thomas C Lee
*Assistant Examiner* — Ameir Myers
(74) *Attorney, Agent, or Firm* — Slater Matsil, LLP (57) ABSTRACT

An optimum combination of a loop unrolling number and a circuit parallel number in a high-level synthesis is determined. A circuit synthesis information generation unit sets, as parameter candidates, a plurality of combinations of a loop unrolling number and a circuit parallel number to generate circuit synthesis information indicating a synthesis circuit obtained by high-level synthesis processing for each of the combinations. An optimum parameter determination unit calculates, for each piece of the generated circuit synthesis information, an estimation processing performance related to the synthesis circuit indicated by the circuit synthesis information, and determines an optimum combination of the loop unrolling number and the circuit parallel number based on the circuit synthesis information based on which a maximum estimation processing performance is obtained.

9 Claims, 6 Drawing Sheets

(56) References Cited

U.S. PATENT DOCUMENTS

2012/0036138 A1* 2/2012 Carrion ................ G06F 30/327
              707/E17.084
2017/0262567 A1* 9/2017 Vassiliev .......... H03K 19/17704
2018/0011957 A1* 1/2018 Cheng .................. G06F 30/327

* cited by examiner

| ID | PARAMETER | | SYNTHESIS RESULT INFORMATION | | |
|---|---|---|---|---|---|
| | LOOP UNROLLING NUMBER M | CIRCUIT PARALLEL NUMBER P | PROCESSING CYCLE NUMBER | OPERATING FREQUENCY [MHz] | STATE SWITCHING CYCLE NUMBER |
| 0 | 1 | 41 | 9 | 300 | 1 |
| 1 | 3 | 15 | 3 | 300 | 1 |
| 2 | 9 | 5 | 1 | 300 | 1 |
| ... | | | | | |

```
#pragma unroll = M
for (int i=0; i<Q; i++) {

/* DESCRIPTION */
       OF PROCESSING
}
```

PARAMETER OPTIMIZATION DEVICE, METHOD AND PROGRAM

This patent application is a national phase filing under section 371 of PCT/JP2019/020104, filed May 21, 2019, which claims the priority of Japanese patent application number 2018-112515, filed Jun. 13, 2018, each of which is incorporated herein by reference in its entirety.

TECHNICAL FIELD

The present invention relates to a parameter optimization technique for optimizing a design parameter used in a high-level synthesis for a processing system in which processing circuits for processing input packets are developed in parallel.

BACKGROUND

In recent years, a technique called "high-level synthesis" for generating RTL (Register Transfer Level) code described in a hardware description language, such as Verilog HDL (Hardware Description Language), based on a source code described in an advanced programming language, such as C/C++, has been put to practical use to automate circuit design along with an increase in the size of a PLD (Programmable Logic Device) such as an FPGA (Field-Programmable Gate Array).

Figure 6:
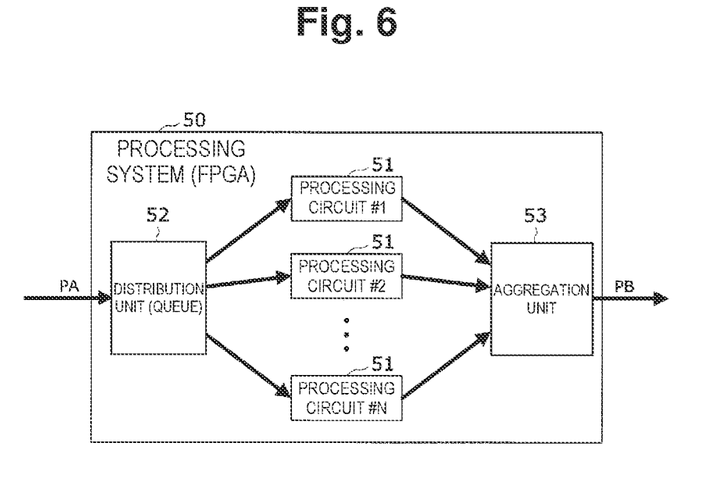
FIG. 6 is a block diagram illustrating an example of a processing system on which parameter optimization is performed.

FIG. 6 is a block diagram illustrating an example of a processing system on which parameter optimization is performed. A processing system 50 illustrated in FIG. 6 is a processing system that is composed of an FPGA as a whole and executes target processing on a plurality of processing circuits 51, which are developed in parallel, by loop unrolling.

For example, as illustrated in FIG. 6, the processing system 50 includes, as a main circuit portion, N (N is an integer greater than or equal to 2) processing circuits (51) #1, #2, . . . , and #N that execute part of target processing in which loop unrolling is preliminarily performed on distributed packets PK, a distribution unit 52 that distributes a plurality of flows of packets PK to be simultaneously input to the processing circuits #1, #2, . . . , and #N developed in parallel, and an aggregation unit 53 that aggregates and outputs processing results obtained by the processing circuits #1, #2, . . . , and #N.

Figure 7:
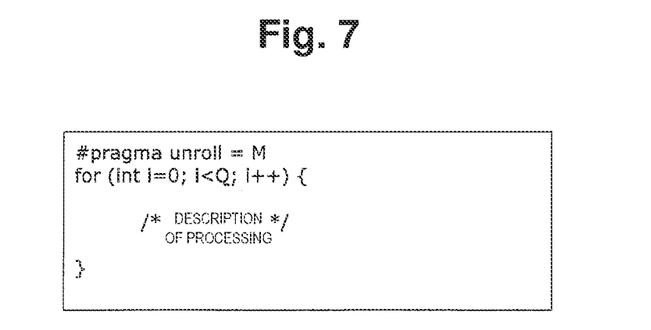
FIG. 7 illustrates an example of a source code in which the loop unrolling number is designated.

In high-level synthesis processing, design parameters that can be set by a designer are prepared to tune the performance of the processing system 50. One of the design parameters used to tune the performance is a loop unrolling number. FIG. 7 illustrates an example of a source code in which the loop unrolling number is designated.

Loop unrolling is a technique for achieving high-speed processing by performing processing at each iteration in loop processing using processing circuits developed in parallel. In an example illustrated in FIG. 7, a loop unrolling number M (M is an integer greater than or equal to 2) is set for a loop total number Q (Q is an integer greater than or equal to 2) of loop processing. This means that, for example, in target processing that requires Q times of loop processing in total, processing corresponding to M loops is developed and collectively executed in one loop, thereby reducing the number of required loops to Q/M times.

In this manner, the loop unrolling number is set to any value, thereby making it possible to designate the number of processing circuits developed in parallel and to design a processing system. In this case, as the loop unrolling number is increased, the processing performance of the processing system is improved. However, along with this, the usage of resources in the processing system is increased.

Figure 8:
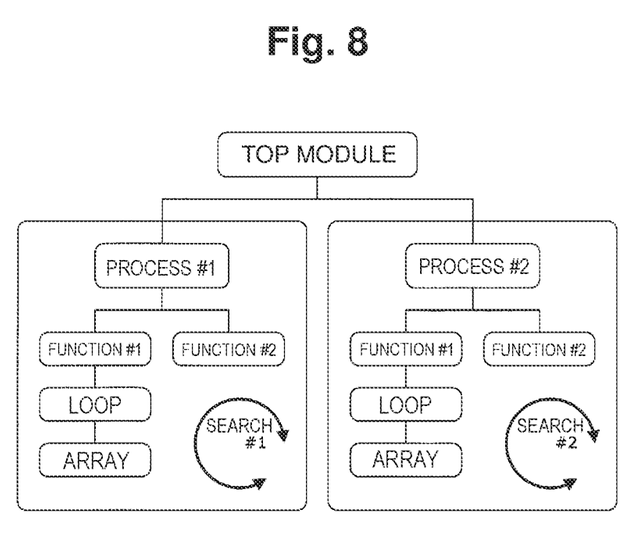
FIG. 8 illustrates an example of a parse tree generated based on a source code description.

The related art proposes a technique for optimizing values of design parameters (for example, the loop unrolling number) designated by a designer in circuit design using high-level synthesis (for example, see Patent Literature 1). FIG. 8 illustrates an example of a parse tree generated based on a source code description. In this technique, the optimization is achieved to minimize the "processing latency per circuit" based on the parse tree representing the operation of processing circuits as illustrated in FIG. 8.

CITATION LIST

Patent Literature

Patent Literature 1: Japanese Patent No. 5516596

SUMMARY

Technical Problem

In general, in the case of tuning the performance of a processing system in a high-level synthesis, the "usage of resources per circuit" increases as the "performance per circuit" about processing circuits in the processing system is improved. Accordingly, assuming that the "amount of resource that can be used in the entire system" is limited and constant in the processing system, there is a trade-off relationship between the "performance per circuit" and the "circuit parallel number".

However, the related art described above has a problem that it is difficult to optimize the trade-off relationship between the "performance per circuit" and the "circuit parallel number" so as to maximize the "performance per circuit" for processing circuits.

In general, as illustrated in FIG. 6, in the case of using a plurality of processing circuits developed in parallel, a processing time overhead occurs. For example, it is assumed that processing is performed while the state in each processing circuit is switched in accordance with a flow of input packets. In such a case, an overhead corresponding to a time period required for switching the state occurs. If the number of flows arriving per unit time is more than or equal to a certain number, the processing performance of the entire system can be increased in some cases by increasing the "circuit parallel number" even though the "performance per circuit" is degraded.

Embodiments of the present invention have been made to solve the above-described problem, and an object of embodiments of the present invention is to provide a parameter optimization technique capable of determining an optimum combination of a loop unrolling number and a circuit parallel number in high-level synthesis processing.

Means for Solving the Problem

To achieve the above-described object, a parameter optimization apparatus according to embodiments of the present invention determines an optimum combination of a loop unrolling number and a circuit parallel number as design parameters used for high-level synthesis processing in a case where circuit design is performed by the high-level synthesis processing for a processing system that executes target processing on a plurality of processing circuits by loop unrolling. The parameter optimization apparatus includes: a circuit synthesis information generation unit that sets, as candidates for the design parameters, a plurality of combinations of the loop unrolling number and the circuit parallel number to generate circuit synthesis information indicating a synthesis circuit obtained by the high-level synthesis processing for each of the plurality of combinations; and an optimum parameter determination unit that calculates, for each piece of the circuit synthesis information, an estimation processing performance related to the synthesis circuit indicated by the circuit synthesis information, and determines an optimum combination of the loop unrolling number and the circuit parallel number based on circuit synthesis information based on which a maximum estimation processing performance is obtained.

Further, in a configuration example of the above-described parameter optimization apparatus according to embodiments of the present invention, the circuit synthesis information generation unit is configured to set the loop unrolling number based on a loop total number representing the total number of loops to be unrolled in the loop unrolling when the combination is set.

Further, in a configuration example of the above-described parameter optimization apparatus according to embodiments of the present invention, the circuit synthesis information generation unit is configured to set the circuit parallel number based on a resource constraint indicating resources that can be used in the processing system when the combination is set.

Further, in a configuration example of the above-described parameter optimization apparatus according to embodiments of the present invention, the optimum parameter determination unit is configured to calculate the estimation processing performance based on the circuit synthesis information, a delay constraint indicating a processing delay allowable in the target processing, and the number of simultaneous inputs of data to be input in parallel to the target processing when the estimation processing performance is calculated.

Further, in a configuration example of the above-described parameter optimization apparatus according to embodiments of the present invention, the processing system includes the plurality of processing circuits that execute part of the target processing in which loop unrolling is preliminarily performed on distributed packets; a distribution unit that distributes a plurality of flows of packets to be simultaneously input to the plurality of processing circuits; and an aggregation unit that aggregates and outputs processing results obtained by the plurality of processing circuits.

Further, in a configuration example of the above-described parameter optimization apparatus according to embodiments of the present invention, the plurality of processing circuits are configured to switch a state for processing the packets depending on a flow of packets distributed from the distribution unit.

Further, a parameter optimization method according to embodiments of the present invention is a parameter optimization method used for a parameter optimization apparatus that determines an optimum combination of a loop unrolling number and a circuit parallel number as design parameters used for high-level synthesis processing in a case where circuit design is performed by the high-level synthesis processing for a processing system that executes target processing on a plurality of processing circuits by loop unrolling, the method including: a circuit synthesis information generation step of setting, by a circuit synthesis information generation unit, a plurality of combinations of the loop unrolling number and the circuit parallel number as candidates for the design parameters to generate circuit synthesis information indicating a synthesis circuit obtained by the high-level synthesis processing for each of the plurality of combinations; and an optimum parameter determination step of calculating, by an optimum parameter determination unit, an estimation processing performance related to the synthesis circuit indicated by the circuit synthesis information for each piece of the circuit synthesis information, and determining an optimum combination of the loop unrolling number and the circuit parallel number based on circuit synthesis information based on which a maximum estimation processing performance is obtained.

Further, a program according to embodiments of the present invention is a program for causing a computer to function as each unit constituting any one of the parameter optimization apparatuses described above.

Effects of Embodiments of the Invention

According to embodiments of the present invention, an optimum combination of a loop unrolling number and a circuit parallel number of a synthesis circuit with a highest estimation processing performance is selected from among a plurality of combinations of the loop unrolling number and the circuit parallel number set as candidates. Accordingly, it is possible to optimize a trade-off relationship between the "performance per circuit" and the "circuit parallel number" about processing circuits, which is a problem caused when the performance of each processing system is tuned in high-level synthesis processing. Further, a process period required for tuning the performance of the processing system in high-level synthesis processing can be considerably reduced, and thus the operation load and operation cost required for tuning can be considerably reduced.

DETAILED DESCRIPTION OF ILLUSTRATIVE EMBODIMENTS

Figure 1:
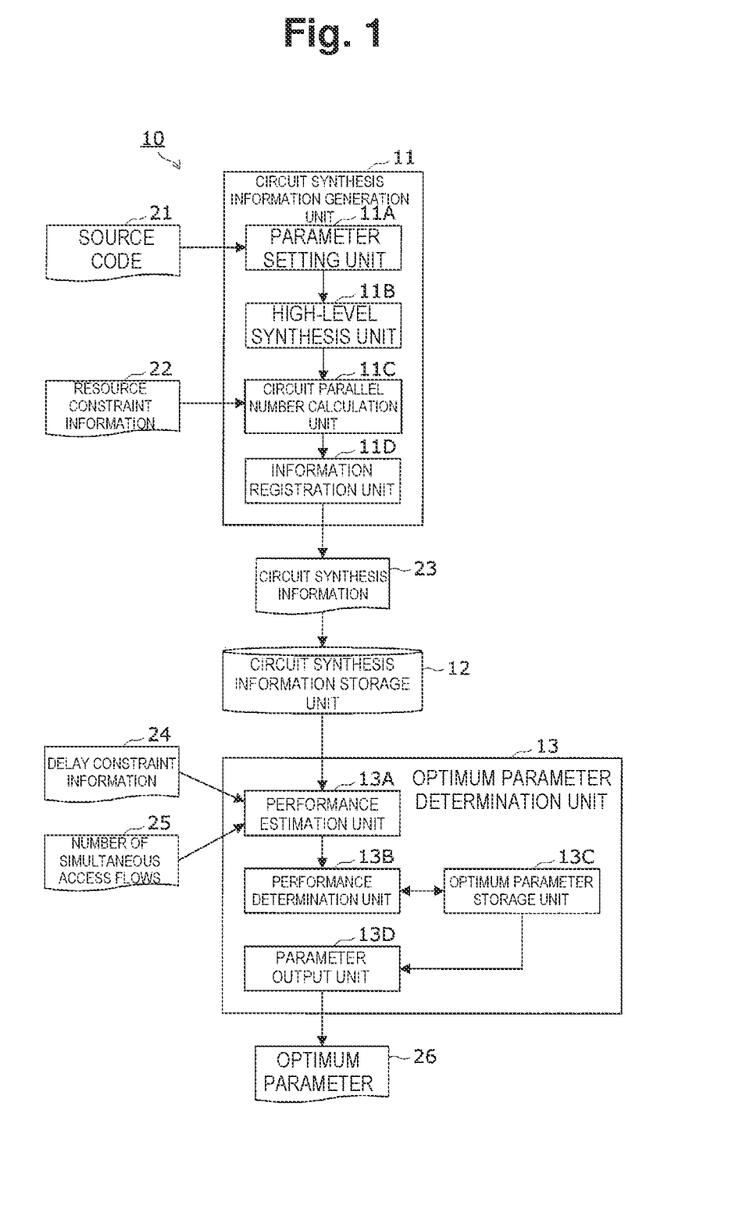
FIG. 1 is a block diagram illustrating a configuration of a parameter optimization apparatus.

Next, embodiments of the present invention will be described with reference to the drawings.
[Parameter Optimization Apparatus]
First, a parameter optimization apparatus 10 according to the present embodiment will be described with reference to FIG. 1. FIG. 1 is a block diagram illustrating a configuration of a parameter optimization apparatus.

The parameter optimization apparatus 10 is composed of an information processing apparatus (computer), such as a server apparatus, as a whole, and includes a function for determining an optimum combination of a loop unrolling number and a circuit parallel number as parameters used for high-level synthesis processing in a case where circuit design is performed by the high-level synthesis processing for a processing system that executes target processing on a plurality of processing circuits by loop unrolling.

The present embodiment illustrates a case where an optimum combination of the loop unrolling number and the circuit parallel number used for high-level synthesis processing is determined for the processing system 50 in which the plurality of processing circuits 51 for processing distributed packets are developed in parallel as illustrated in FIG. 6 described above. Note that the processing system on which parameter optimization is performed is not limited to the processing system 50 that processes packets. The same operation and effects can be obtained by applying the present embodiment to any processing system that executes target processing on a plurality of processing circuits by loop unrolling.

Assume that, like in the configuration illustrated in FIG. 6 described above, the processing system 50 includes, as a main circuit portion, the N (N is an integer greater than or equal to 2) processing circuits (51) #1, #2, . . . , and #N, the distribution unit 52, and the aggregation unit 53. The processing circuits (51) #1, #2, . . . , and #N execute part of the target processing in which loop unrolling is preliminarily performed on the distributed packets PK. The distribution unit 52 distributes a plurality of flows of packets PK to be simultaneously input to the processing circuits (51)#1, #2, . . . , and #N which are developed in parallel. The aggregation unit 53 aggregates and outputs processing results obtained by the processing circuits (51) #1, #2, . . . , and #N.

As illustrated in FIG. 1, the parameter optimization apparatus 10 includes, as main functional units, a circuit synthesis information generation unit 11, a circuit synthesis information storage unit 12, and an optimum parameter determination unit 13. Among these functional units, the circuit synthesis information generation unit 11 and the optimum parameter determination unit 13 are implemented by cooperatively operating a CPU and a program. This program is preliminarily stored in a storage unit (not illustrated) of the parameter optimization apparatus 10 from an external device or a recording medium (which are not illustrated). Note that the program can also be provided by being recorded on a recording medium, or may be provided via a communication network.

The circuit synthesis information generation unit 11 includes the following two functions. The first function is to set, as candidates for design parameters, a plurality of combinations of the loop unrolling number M (M is an integer greater than or equal to 2) and the circuit parallel number N, based on the loop total number Q which indicates the total number of loops to be unrolled in the loop unrolling and is described in an input source code 21, and the resource constraint which represents resources usable in the processing system 50 and is designated by resource constraint information 22. The second function is to generate, for each of the combinations, circuit synthesis information 23 indicating the synthesis circuit obtained by high-level synthesis processing when the combination is applied, and to register the generated circuit synthesis information in the circuit synthesis information storage unit 12.

The circuit synthesis information storage unit 12 is composed of a storage device, such as a hard disk or a semiconductor memory, and includes a function for storing the circuit synthesis information 23 generated by the circuit synthesis information generation unit 11.

Figure 2:
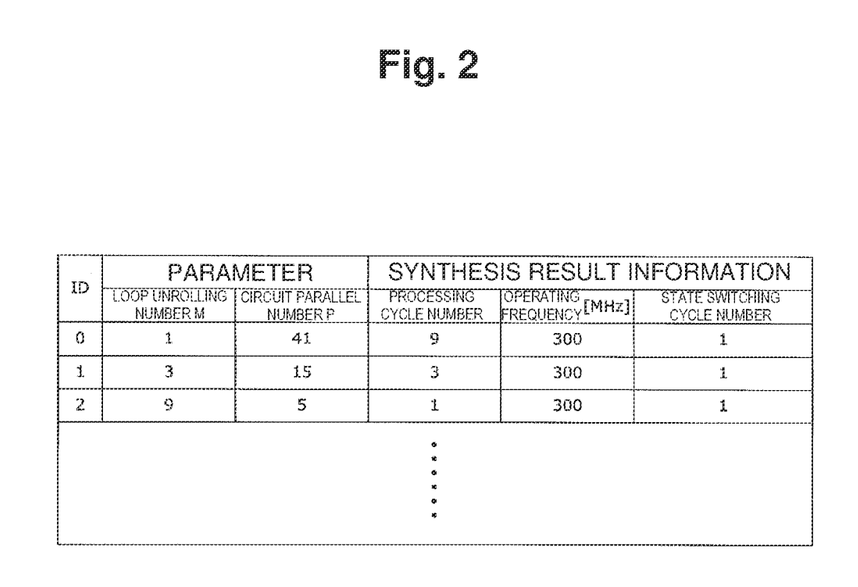
FIG. 2 is a configuration example of circuit synthesis information.

FIG. 2 illustrates a configuration example of the circuit synthesis information. As illustrated in FIG. 2, the circuit synthesis information 23 includes synthesis result information including parameters indicating combinations of the loop unrolling number M and the circuit parallel number N, the number of processing cycles indicating the configuration of the synthesis circuit, an operating frequency [MHz], and the number of state switching cycles. An ID for identifying each combination is assigned to each of these pieces of circuit synthesis information 23, and the circuit synthesis information 23 is registered in the circuit synthesis information storage unit 12.

The optimum parameter determination unit 13 includes the following two functions. The first function is to calculate an estimation processing performance P obtained by the synthesis circuit indicated by the circuit synthesis information 23 for each piece of the circuit synthesis information 23 registered in the circuit synthesis information storage unit 12 based on a delay constraint indicating a processing delay allowable in the target processing for the processing system 50 designated by delay constraint information 24, and the number of simultaneous access flows (simultaneous input number) 25 indicating the number of flows of packets (data) to be simultaneously input in parallel to the target processing for the processing system 50. The second function is to determine an optimum combination of the loop unrolling number M and the circuit parallel number N based on the circuit synthesis information 23 based on a maximum estimation processing performance $P_{max}$ among the estimation processing performances, and outputs the maximum estimation processing performance as an optimum parameter 26.

[Circuit Synthesis Information Generation Unit]

Next, the circuit synthesis information generation unit 11 will be described in detail with reference to FIG. 1.

As illustrated in FIG. 1, the circuit synthesis information generation unit 11 includes, as main processing units, a parameter setting unit 11A, a high-level synthesis unit 11B, a circuit parallel number calculation unit 11C, and an information registration unit 11D.

The parameter setting unit nA includes a function for setting a plurality of loop unrolling numbers M as candidates based on the loop total number Q designated by the source code 21.

The high-level synthesis unit 11B includes a function for synthesizing by high-level synthesis processing, for each loop unrolling number M set by the parameter setting unit 11A, the synthesis circuits obtained when the loop unrolling number M is applied.

The circuit parallel number calculation unit 11C includes a function for calculating and setting the circuit parallel number N as a candidate for each synthesis circuit based on the resource constraint indicating resources usable in the processing system 50 designated by the resource constraint information 22, and the usage of resources in the synthesis circuits synthesized by the high-level synthesis unit 11B.

The information registration unit 11D includes a function for assigning an ID for identifying each combination and synthesis result information indicating the configuration of the corresponding synthesis circuit to the combination of the loop unrolling number M and the circuit parallel number N set as a candidate, and registering the obtained circuit synthesis information 23 to the circuit synthesis information storage unit 12.

[Optimum Parameter Determination Unit]

Next, the optimum parameter determination unit 13 will be described in detail with reference to FIG. 1.

As illustrated in FIG. 1, the optimum parameter determination unit 13 includes, as main processing units, a performance estimation unit 13A, a performance comparison unit 13B, an optimum parameter storage unit 13C, and a parameter output unit 13D.

The performance estimation unit 13A includes a function for calculating, for each piece of circuit synthesis information 23 registered in the circuit synthesis information storage unit 12, the estimation processing performance P as a performance value for the processing system 50 obtained when the combination of the loop unrolling number M and the circuit parallel number N included in the circuit synthesis information 23 is applied.

The performance comparison unit 13B includes a function for comparing the estimation processing performance P calculated by the performance estimation unit 13A with the maximum estimation processing performance $P_{max}$ stored in the optimum parameter storage unit 13C, and a function for updating $P_{max}$ with P when P is greater than $P_{max}$, and storing the combination of the loop unrolling number M and the circuit parallel number N corresponding to P as an optimum parameter in the optimum parameter storage unit 13C.

The parameter output unit 13D includes a function for acquiring and outputting the optimum parameter stored in the optimum parameter storage unit 13C after completion of the comparison between P and $P_{max}$ about all the circuit synthesis information 23 registered in the circuit synthesis information storage unit 12.

Operation of Present Embodiment

Next, an operation of the parameter optimization apparatus 10 according to the present embodiment will be described.

[Circuit Synthesis Information Generation Operation]

Figure 3:
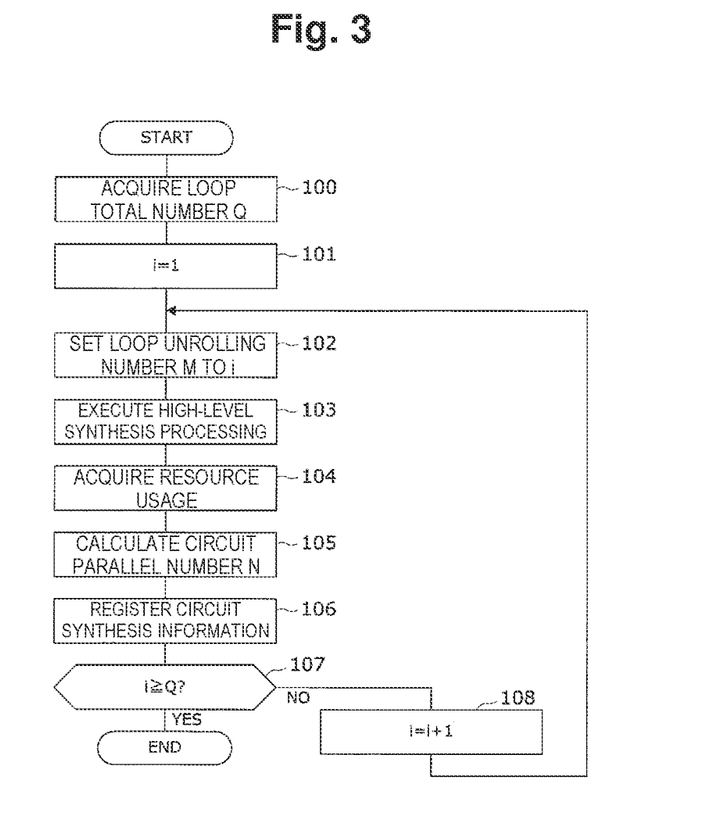
FIG. 3 is a flowchart illustrating circuit synthesis information generation processing.

First, a circuit synthesis information generation operation of the circuit synthesis information generation unit 11 will be described with reference to FIG. 3. FIG. 3 is a flowchart illustrating circuit synthesis information generation processing.

First, the parameter setting unit 11A acquires the loop total number Q from, for example, the description of for-loop included in the source code 21 as illustrated in FIG. 7 (step 100).

Next, the parameter setting unit 11A initializes a variable i with "1" to change and set loop unrolling numbers $M_i$ one by one within a range from 1 to Q (step 101), and sets the value i as the loop unrolling number $M_i$ (step 102).

Next, the high-level synthesis unit 11B synthesizes the synthesis circuits obtained when the loop unrolling number $M_i$ set by the parameter setting unit 11A is applied, from the source code 21 by using a high-level synthesis comparator (step 103).

Next, the circuit parallel number calculation unit 11C acquires a resource usage S, for each processing circuit 51 from the synthesis result information about the synthesis circuits synthesized by the high-level synthesis unit 11B (step 104), and calculates a circuit parallel number $N_i$ of the loop unrolling number $M_i$ of synthesis circuits based on the resource usage $S_i$ and the resource constraint $S_{max}$ indicating resources usable in the processing system 50 designated by the resource constraint information 22 (step 105).

In this case, $N_i$ may be calculated by selecting the maximum number at which $S_i \times N_i$ is less than or equal to $S_{max}$ as $N_i$. However, the method is not limited to this example. For example, $N_i$ may be calculated in consideration of the amount of resource to be used, such as peripheral circuits required for parallel processing, in addition to the synthesis circuits synthesized from the source code 21.

After that, the information registration unit 11D assigns an ID for identifying each combination and synthesis result information indicating the configuration of the corresponding synthesis circuit to the obtained combination of the loop unrolling number $M_i$ and the circuit parallel number $N_i$, and registers the obtained circuit synthesis information 23 in the circuit synthesis information storage unit 12 (step 106).

Next, the parameter setting unit 11A checks whether the variable i has reached the loop total number Q (step 107). If the variable i has not reached the loop total number Q (step 107: NO), the variable i is incremented (i=i+1) (step 108), and then the processing returns to step 102.

On the other hand, when i reaches Q (step 107: YES), a series of circuit synthesis information generation processing is terminated.

[Optimum Parameter Determination Operation]

Figure 4:
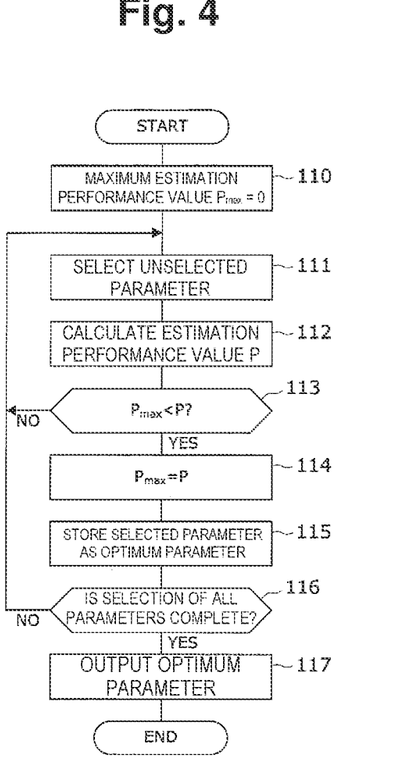
FIG. 4 is a flowchart illustrating optimum parameter determination processing.

Next, an optimum parameter determination operation performed by the optimum parameter determination unit 13 will be described with reference to FIG. 4. FIG. 4 is a flowchart illustrating optimum parameter determination processing.

First, the performance estimation unit 13A initializes the maximum estimation processing performance $P_{max}$ stored in the optimum parameter storage unit 13C with zero (step no), and then selects one piece of unselected circuit synthesis information 23 from the circuit synthesis information storage unit 12 (step 111), and calculates the estimation processing performance P as the performance value for the processing system 50 obtained when the combination of the loop unrolling number M and the circuit parallel number N included in the selected circuit synthesis information 23 is applied (step 112). The method of calculating the estimation processing performance P will be described below.

The performance comparison unit 13B compares the estimation processing performance P calculated by the performance estimation unit 13A with the maximum estimation processing performance $P_{max}$ stored in the optimum parameter storage unit 13C (step 113). If P is less than or equal to $P_{max}$ (step 113: NO), the processing returns to step 111.

On the other hand, if P is greater than $P_{max}$ (step 113: YES), the performance comparison unit 13B updates $P_{max}$ with P (step 114), and stores the combination of the loop unrolling number M and the circuit parallel number N corresponding to P as the optimum parameter 26 in the optimum parameter storage unit 13C (step 115).

After that, the parameter output unit 13D checks whether the selection of all the circuit synthesis information 23 registered in the circuit synthesis information storage unit 12 is complete (step 116). If the selection is not complete (step 116: NO), the processing returns to step 111.

On the other hand, if the selection of all the circuit synthesis information 23 is complete (step 116: YES), the parameter output unit 13D acquires and outputs the optimum parameter 26 stored in the optimum parameter storage unit 13C (step 117), and then a series of optimum parameter determination processing is terminated.

Note that when the performance comparison unit 13B stores the optimum parameter in the optimum parameter storage unit 13C, an ID representing the combination of the loop unrolling number M and the circuit parallel number N included in the selected circuit synthesis information 23 may be stored. Further, when the parameter output unit 13D outputs the optimum parameter, an ID representing the combination of the loop unrolling number M and the circuit parallel number N may be output.

[Estimation Processing Performance Calculation Method]

Figure 5:
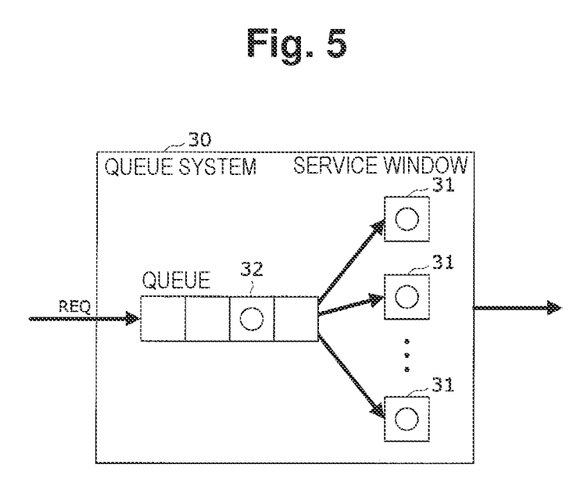
FIG. 5 is a conceptual diagram illustrating a general queue system.

Next, an estimation processing performance calculation method in the performance estimation unit 13A will be described with reference to FIG. 5. FIG. 5 is a conceptual diagram illustrating a general queue system.

In the estimation technique, in order to stochastically evaluate a processing delay in the processing system 50 where input packets are randomly arrived, the processing system 50 on which optimization processing is performed is regarded as a queue system 30 illustrated in FIG. 5, and the performance is estimated using a theoretical formula based on a queue theory. In this case, the estimation processing performance is defined as a "maximum input rate that satisfies a delay constraint". It is assumed that the delay constraint indicating that "the probability that the delay is within "a" seconds is b % or more" is given by the delay constraint information 24.

As illustrated in FIG. 5, the queue system 30 is composed of a plurality of service windows 31 and a queue. When this queue system is compared with the processing system 50 illustrated in FIG. 6, the externally input packets PK correspond to the requests REQ that randomly arrive, the processing circuits 51 developed in parallel correspond to the service windows 31, and a queue (not illustrated) for storing packets in the distribution unit 52 corresponds to a queue 32. Note that the queue is implemented using a register or memory.

Next, an estimation equation used for performance estimation will be described.

A theoretical formula for stochastically evaluating a waiting time for each request in the target queue system based on the queue theory is expressed by the following Formula (1).

[Formula 1]

$$C = \frac{n \times B}{n - E \times (1-B)} \times \exp\left(\frac{(E-n) \times t}{AHT}\right) \quad (1)$$

In Formula (1), "C" represents a probability that a waiting time of each request REQ in the queue system 30 exceeds an allowable value t, "n" represents the number of service windows, "E" represents a measure for traffic, i.e., the amount of request REQ, "AHT" represents a service time for each request REQ, and "B" represents a loss probability assuming that the target system is a call loss system. The call loss system described herein refers to a system including a function for destroying a new request REQ that has arrived in a state where all the service windows 31 are being used, without arranging the request REQ in the queue.

In Formula (1), a loss probability B is calculated by the following Formula (2).

[Formula 2]

$$B = \frac{\frac{E^n}{n!}}{1 + \sum_{k=1}^{n} \frac{E^n}{n!}} \quad (2)$$

In Formula (2), traffic E is calculated by the following Formula (3), where $\lambda$ represents a required arrival number per unit time. Definitions of the other variables are similar to those in Formula (1).

[Formula 3]

$$E = \lambda \times AHT \quad (3)$$

Further, the relationship between a delay input rate R and the required arrival number $\lambda$ is expressed as Formula (4), where L represents a packet length.

[Formula 4]

$$R = \lambda \times L \quad (4)$$

In sum, when the delay constraint indicates that "the probability that the delay is within "a" seconds is b % or more", the value of the allowable value t is set to "a" seconds and the delay input rate R, i.e., the traffic E is increased to thereby obtain a maximum input rate $R_{max}$ at which the value of the probability C is maintained at b %. The obtained $R_{max}$ corresponds to the estimation processing performance P related to the queue system 30.

[AHT Calculation Method]

Next, an AHT calculation method will be described.

The processing system 50 on which parameter optimization is performed performs processing while switching the state in each processing circuit 51 depending on the flow of input packets in each processing circuit 51. Accordingly, when the flow of packets being currently processed is different from the flow of packets to be subsequently input, state switching processing in each processing circuit 51 occurs and a processing time overhead occurs.

Further, as the number of flows to be simultaneously input to the same processing circuit 51 increases, the probability that the flow of packets being currently processed is different from the flow of packets to be subsequently input increases. Accordingly, as the number of flows to be simultaneously input to the same processing circuit 51 increases, the probability of occurrence of an overhead during processing due to state switching processing in each processing circuit 51 increases.

In view of the above, according to embodiments of the present invention, an expectation value AHT is calculated in consideration of the probability of occurrence of the processing time overhead due to state switching processing.

The following Formula (5) is a formula for calculating AHT.

[Formula 5]

$$AHT = P_{same} \times AHT_\alpha + (1 - P_{same}) \times AHT_\beta \quad (5)$$

In Formula (5), $P_{same}$ represents a probability that the flow of input packets is the same as the previous flow of input packets, $AHT_\alpha$ represents a processing time per packet when state switching does not occur, and $AHT_\beta$ represents a processing time per packet when state switching occurs. $AHT_\alpha$ and $AHT_\beta$ are calculated based on information held in the circuit synthesis information storage unit 12.

In Formula (5), $P_{same}$ is calculated by the following Formula (6).

[Formula 6]

$$P_{same} = \frac{n}{N_{flow}} \quad (6)$$

In Formula (6), a service window number n represents a circuit parallel number, $N_{flow}$ represents the number of simultaneous access flows to the system. In this case, $P_{same}$ is calculated assuming that flows of packets are randomly input to the processing system 50 and the arrival probability of each flow is $1/N_{flow}$. However, $P_{same}$ may be calculated assuming that the arrival probability varies for each flow.

Advantageous Effects of Present Embodiment

In this manner, in the present embodiment, the circuit synthesis information generation unit 11 sets a plurality of combinations of the loop unrolling number M and the circuit parallel number N as parameter candidates to generate, for each of the combinations, the circuit synthesis information 23 indicating the synthesis circuit obtained by high-level synthesis processing, and the optimum parameter determination unit 13 calculates, for each piece of the generated circuit synthesis information 23, the estimation processing performance P about the synthesis circuit indicated by the circuit synthesis information 23, and determines an optimum combination of the loop unrolling number M and the circuit parallel number N based on the circuit synthesis information 23 based on which the maximum estimation processing performance $P_{max}$ is obtained.

Thus, an optimum combination of the loop unrolling number M and the circuit parallel number N of the synthesis circuit having the highest estimation processing performance $P_{max}$ as the estimation processing performance P is selected from the plurality of combinations of the loop unrolling number M and the circuit parallel number N set as candidates. Accordingly, it is possible to optimize the trade-off relationship between the "performance per circuit" and the "circuit parallel number" about processing circuits 51, which is a problem caused when the performance of each processing system 50 is tuned in high-level synthesis processing. Further, a process period required for tuning the performance of the processing system 50 in high-level synthesis processing can be considerably reduced, and thus the operation load and operation cost required for tuning can be considerably reduced.

Further, in the present embodiment, the circuit synthesis information generation unit 11 may set the loop unrolling number based on the loop total number indicating the total number of loops to be unrolled in the loop unrolling when the combination is set.

Further, in the present embodiment, the circuit synthesis information generation unit 11 may set the circuit parallel number based on a resource constraint indicating resources that can be used in the processing system.

With this configuration, an optimum loop unrolling number and an optimum circuit parallel number can be specified for the processing system 50 having the specific loop total number and the specific resource constraint.

Further, in the present embodiment, when the optimum parameter determination unit 13 calculates the estimation processing performance P, the estimation processing performance P may be calculated based on the circuit synthesis information 23, the delay constraint indicating the processing delay allowable in target processing, and the simultaneously input number of data to be input in parallel to the target processing.

With this configuration, even when the processing time varies depending on the flow of input packets, optimization processing can be performed in consideration of the probability of arrival of each flow of packets externally supplied, and the circuit performance can be optimized by reflecting actual operation environments.

Extension of Embodiments

While the present invention has been described above with reference to embodiments, the present invention is not limited to the above-described embodiments. The configuration and details of the present invention can be modified in various ways that can be understood by those skilled in the art within the scope of the present invention.

REFERENCE SIGNS LIST 10 parameter optimization apparatus
11 circuit synthesis information generation unit
11A parameter setting unit
11B high-level synthesis unit
11C circuit parallel number calculation unit
11D information registration unit
12 circuit synthesis information storage unit
13 optimum parameter determination unit
13A performance estimation unit
13B performance comparison unit
13C optimum parameter storage unit
13D parameter output unit
21 source code
22 resource constraint information
23 circuit synthesis information
24 delay constraint information
25 number of simultaneous access flows
26 optimum parameter

The invention claimed is:
1. A parameter optimization apparatus comprising:
a processor;
a non-transitory storage medium coupled to the processor, the storage medium storing instructions that, when executed by the processor, cause the processor to:
  set, as candidates for design parameters, a plurality of combinations of a loop unrolling number and a circuit parallel number to generate circuit synthesis information indicating a synthesis circuit obtained by a high-level synthesis processing for each of the plurality of combinations, wherein set, as candidates for design parameters, the plurality of combinations of the loop unrolling number and the circuit parallel number comprises:
  (1) determine a loop total number indicating a total number of loops be unrolled;
  (2) execute high-level synthesis processing to generate circuit synthesis information indicating a synthesis circuit for a loop unrolling number;
  (3) determine a resource usage of each processing circuit from the synthesis result information of the synthesized synthesis circuit for the loop unrolling number;
  (4) calculate a circuit parallel number based on the resource usage for the loop unrolling number and a resource constraint indicating usable resources;

(5) store, in a non-transitory storage medium, a combination of loop unrolling number and circuit parallel number as a candidate for design parameters;
(6) repeat steps (2) through (5) for each loop unrolling number from 1 to loop total number;

calculate, for each of the stored combinations of a loop unrolling number and a circuit parallel number, an estimation processing performance related to the synthesis circuit indicated by the circuit synthesis information;

determine an optimum combination of the loop unrolling number and the circuit parallel number based on the circuit synthesis information for which a maximum estimation processing performance is obtained; and output the determined optimum combination of the loop unrolling number and the circuit parallel number that obtains the maximum estimation processing performance, wherein the determined optimum combination of the loop unrolling number and the circuit parallel number are used as design parameters for a circuit design when the circuit design is performed by the high-level synthesis processing for a processing system that executes a target processing on a plurality of processing circuits by loop unrolling.

2. The parameter optimization apparatus according to claim 1, wherein the instructions that, when executed by the processor, further cause the processor to calculate the estimation processing performance based on the circuit synthesis information, a delay constraint indicating a processing delay allowable in the target processing, and a number of simultaneous inputs of data to be input in parallel to the target processing.

3. The parameter optimization apparatus according to claim 1, wherein the processing system includes:
the plurality of processing circuits that execute part of the target processing in which loop unrolling is preliminarily performed on distributed packets;
a distributor that distributes a plurality of flows of packets to be simultaneously input to the plurality of processing circuits; and
an aggregator that aggregates and outputs processing results obtained by the plurality of processing circuits.

4. The parameter optimization apparatus according to claim 3, wherein the plurality of processing circuits switch a state for processing the packets depending on a flow of packets distributed from the distributor.

5. A parameter optimization method comprising:
setting, by a processor, a plurality of combinations of a loop unrolling number and a circuit parallel number as candidates for design parameters to generate circuit synthesis information indicating a synthesis circuit obtained by high-level synthesis processing for each of the plurality of combinations, wherein setting, by the processor, the plurality of combinations of the loop unrolling number and the circuit parallel number as candidates for design parameters comprises:
(1) determining, by the processor, a loop total number Q indicating a total number of loops be unrolled;
(2) executing, by the processor, high-level synthesis processing to generate circuit synthesis information indicating a synthesis circuit for a loop unrolling number M;
(3) determining, by the processor, a resource usage S of each processing circuit from the synthesis result information of the synthesized synthesis circuit for the loop unrolling number M;
(4) calculating, by a processor, a circuit parallel number N based on the resource usage S for the loop unrolling number M and a resource constraint indicating usable resources;
(5) storing, by the processor, in a non-transitory storage medium a combination of loop unrolling number M and circuit parallel number N as a candidate for design parameters;
(6) repeating, by the processor, steps (2) through (5) for each loop unrolling number M from 1 to loop total number Q;

calculating, by the processor, an estimation processing performance related to the synthesis circuit indicated by the circuit synthesis information for each of the stored combinations of a loop unrolling number and a circuit parallel number;

determining, by the processor, an optimum combination of the loop unrolling number and the circuit parallel number based on the circuit synthesis information for which a maximum estimation processing performance is obtained; and outputting the determined optimum combination of the loop unrolling number and the circuit parallel number that obtains the maximum estimation processing performance, wherein the determined optimum combination of the loop unrolling number and the circuit parallel number are used as design parameters for a circuit design, when circuit design is performed by the high-level synthesis processing for a processing system that executes loop unrolling on a target processing on a plurality of processing circuits.

6. The parameter optimization method according to claim 5, wherein calculating the estimation processing performance calculates the estimation processing performance based on the circuit synthesis information, a delay constraint indicating a processing delay allowable in the target processing, and a number of simultaneous inputs of data to be input in parallel to the target processing.

7. The parameter optimization method according to claim 5, further comprising:
executing part of the target processing in which loop unrolling is preliminarily performed on distributed packets;
distributing a plurality of flows of packets to be simultaneously input to the plurality of processing circuits; and
aggregating and outputting processing results obtained by the plurality of processing circuits.

8. The parameter optimization method according to claim 7, wherein the plurality of processing circuits switch a state for processing the packets depending on a flow of packets distributed from a distributor.

9. A computer program product comprising at least one non-transitory computer-readable medium having computer-readable code portions stored therein, the computer-readable program code portions comprising an executable portion configured to cause a computer to perform the steps of the parameter optimization method of claim 5.

* * * * *